(12) United States Patent
Kung et al.

(10) Patent No.: US 12,218,075 B2
(45) Date of Patent: Feb. 4, 2025

(54) PACKAGE STRUCTURE

(71) Applicant: Advanced Semiconductor Engineering, Inc., Kaohsiung (TW)

(72) Inventors: Cheng-Yuan Kung, Kaohsiung (TW);
Hsu-Chiang Shih, Kaohsiung (TW);
Hung-Yi Lin, Kaohsiung (TW);
Chien-Mei Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 374 days.

(21) Appl. No.: 17/566,575

(22) Filed: Dec. 30, 2021

(65) Prior Publication Data

US 2023/0215816 A1 Jul. 6, 2023

(51) Int. Cl.
*H01L 23/00* (2006.01)
*H01L 23/498* (2006.01)
*H01L 23/538* (2006.01)
*H01L 25/065* (2023.01)

(52) U.S. Cl.
CPC ...... *H01L 23/562* (2013.01); *H01L 23/49822* (2013.01); *H01L 23/49838* (2013.01); *H01L 23/5383* (2013.01); *H01L 24/16* (2013.01); *H01L 25/0655* (2013.01); *H01L 2224/16227* (2013.01); *H01L 2924/1511* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 2021/0043571 A1* | 2/2021 | Hou | ...... | H01L 21/486 |
| 2021/0118812 A1* | 4/2021 | Liu | ...... | H01L 21/4871 |
| 2021/0333715 A1* | 10/2021 | Topping | ...... | H01L 21/6833 |
| 2021/0335715 A1* | 10/2021 | Kao | ...... | H01L 21/4857 |
| 2021/0375768 A1* | 12/2021 | Tsou | ...... | H01L 23/49838 |
| 2022/0342150 A1* | 10/2022 | Karhade | ...... | G02B 6/4274 |

\* cited by examiner

*Primary Examiner* — Long Pham
(74) *Attorney, Agent, or Firm* — FOLEY & LARDNER LLP

(57) ABSTRACT

A package structure includes an encapsulant, a patterned circuit structure, at least one electronic component and a shrinkage modifier. The patterned circuit structure is disposed on the encapsulant and includes a pad. The electronic component is disposed on the patterned circuit structure, and includes a bump electrically connected to the pad. The shrinkage modifier is encapsulated in the encapsulant and configured to reduce a relative displacement between the bump and the pad along a horizontal direction in an environment of temperature variation.

18 Claims, 20 Drawing Sheets

PACKAGE STRUCTURE

BACKGROUND

1. Field of the Disclosure

The present disclosure relates to a package structure and a method for manufacturing the package structure.

2. Description of the Related Art

In a semiconductor package structure, two semiconductor dice may be electrically connected by a redistribution layer. For example, two semiconductor dice may be disposed on a redistribution layer, and then an encapsulant may be formed on the redistribution layer to encapsulate the two semiconductors, thus forming the semiconductor package structure. However, stress tends to be concentrated at a gap between the two semiconductor dice, resulting in crack of the redistribution layer corresponding to the gap.

SUMMARY

In some embodiments, a package structure includes an encapsulant, a patterned circuit structure, at least one electronic component and a shrinkage modifier. The patterned circuit structure is disposed on the encapsulant and includes a pad. The electronic component is disposed on the patterned circuit structure, and includes a bump electrically connected to the pad. The shrinkage modifier is encapsulated in the encapsulant and configured to reduce a relative displacement between the bump and the pad along a horizontal direction in an environment of temperature variation.

In some embodiments, a package structure includes an interposer, a plurality of electronic components, and a decoupling structure. The electronic components are disposed above the interposer and electrically communicating with each other through the interposer. The decoupling structure is electrically connected to the electronic components through the interposer.

In some embodiments, a package structure includes an encapsulant, a bridge interposer, and a plurality of conductive pillars. The encapsulant has a bridge region, a power region around the bridge region, and a signal region around the power region. The bridge interposer is encapsulated in the encapsulant, and disposed in the bridge region and the power region of the encapsulant. The bridge interposer includes a first conductive structure disposed in the bridge region of the encapsulant and a second conductive structure disposed in the power region of the encapsulant. A circuit density of the first conductive structure is greater than a circuit density of the second conductive structure. The conductive pillars are disposed in the signal region of the encapsulant. The circuit density of the second conductive structure is greater than a circuit density of the conductive pillars.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
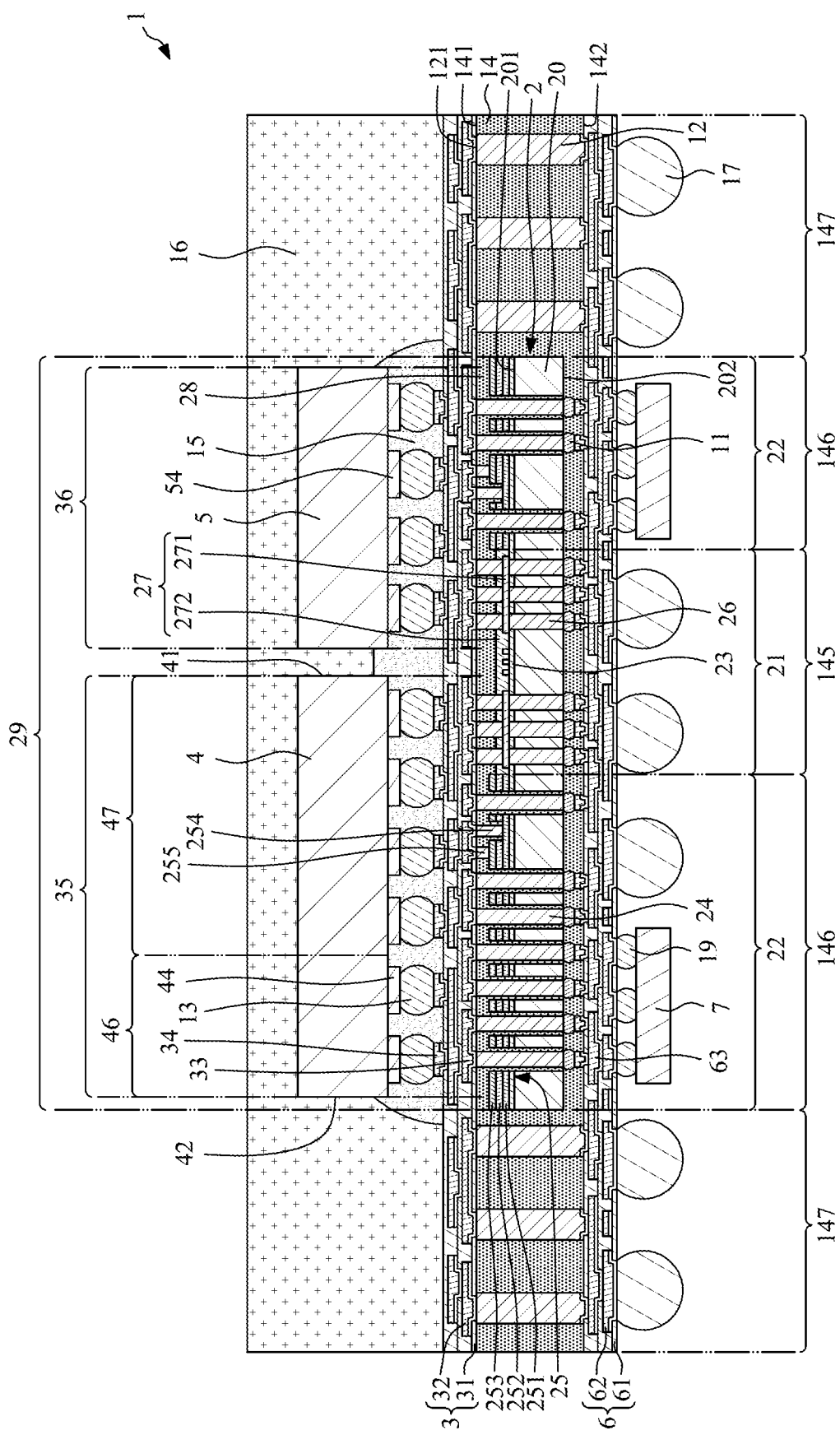
FIG. 1 illustrates a cross sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A bridge die is considered as a possible solution to the aforementioned crack of the redistribution layer corresponding to the gap between the two semiconductor dice. For example, a modified semiconductor package structure may include a bridge die, an encapsulant encapsulating the bridge die, a redistribution layer disposed on the encapsulant, and a first semiconductor die and a second semiconductor die disposed side by side on the redistribution layer. Generally, the position of the bridge die corresponds to a gap between the two semiconductor dice, while a large portion of the first semiconductor die and/or the second semiconductor die may exceed a lateral surface of the bridge die. Accordingly, the bridge die cannot support the entire first semiconductor die and/or the entire second semiconductor die, thus cannot efficiently eliminate the aforementioned crack.

Hence, at least some embodiments of the present disclosure provide for a package structure which is able to sufficiently eliminate the aforementioned crack.

FIG. 1 illustrates a cross sectional view of a package structure 1 according to some embodiments of the present disclosure. The package structure 1 may be an electronic package structure or a semiconductor package structure. The package structure 1 may include a second patterned circuit structure 6, a shrinkage modifier or a shrinkage inhibiting substance 2 (e.g., an interposer 2, which may include a first decoupling structure 25), a plurality of conductive pillars 12, a first encapsulant 14, a first patterned circuit structure 3, at least one electronic component (e.g., a first electronic component 4 and/or a second electronic component 5), a plurality of solder materials 13, an underfill 15, a second encapsulant 16, at least one second decoupling structure 7 and at least one external connector 17.

The second patterned circuit structure 6 may be a conductive structure, a wiring structure, a stacked structure, a redistribution structure or a substrate structure. The second patterned circuit structure 6 may include at least one dielectric layer 61 and at least one redistribution layer 62. As shown in FIG. 1, the second patterned circuit structure 6 includes three dielectric layers 61 and two redistribution layers 62. However, the amount of the dielectric layers 61 and the amount of the redistribution layers 62 are not limited in the present disclosure. In some embodiments, the redistribution layer 62 may include a seed layer and a conductive layer on the seed layer. However, in other embodiments, the seed layer may be omitted. The redistribution layer 62 of the second patterned circuit structure 6 includes at least one inner via 63. As shown in FIG. 1, the inner via 63 may taper downwardly.

The shrinkage modifier 2 (e.g., the interposer 2) is disposed on and electrically connected to the second patterned circuit structure 6. The interposer 2 may include a main body 20. The main body 20 has a first surface 201 and a second surface 202 opposite to the first surface 201. The interposer 2 may include an inorganic material. The interposer 2 may include a ceramic material, silicon material or glass. For example, the main body 20 of the interposer 2 may be made of the ceramic material. By using the ceramic material, the interposer 2 can provide a favorable rigidity to enhance the structural strength of the package structure 1.

The interposer 2 has a first region 21 (e.g., a bridge region 21) and a second region 22 (e.g., a power region 22). The interposer 2 may be also referred to as a "bridge interposer". The power region 22 may surround the bridge region 21. In some embodiments, the bridge region 21 may be adapted for signal transmission between two electronic components (e.g., the first electronic component 4 and the second electronic component 5) electrically connected to the interposer 2. For example, the interposer 2 may include a circuit structure 27 disposed on the main body 20 (e.g., on the first surface 201 of the main body 20) and in the bridge region 21, and the circuit structure 27 is adapted for signal transmission between the first electronic component 4 and the second electronic component 5. As shown in FIG. 1, the interposer 2 may include a base layer 23 disposed on the first surface 201 of the main body 20. The base layer 23 may be made of a dielectric material, and may serve for enhancing binding strength between the main body 20 and a component disposed thereon. The base layer 23 may also serve for electrical insulation purpose. The circuit structure 27 may include a conductive layer 271 and a dielectric layer 272. The conductive layer 271 is disposed on the base layer 23, and the dielectric layer 272 is disposed on the base layer 23 to cover the conductive layer 271. The conductive layer 271 may include at least one circuit layer. However, in some embodiments, the base layer 23 may be omitted, and the conductive layer 271 and the dielectric layer 272 may be directly disposed on and contact the first surface 201 of the main body 20.

The power region 22 may be adapted for power delivery between the electronic component (e.g., the first electronic component 4 and/or the second electronic component 5) and the second patterned circuit structure 6. The interposer 2 may include a plurality of conductive vias (e.g., a plurality of first conductive vias 24 and a plurality of second conductive vias 26) extending through the main body 20 (e.g., extending through the first surface 201 and the second surface 202 of the main body 20) and configured to electrically connect the second patterned circuit structure 6. As shown in FIG. 1, the interposer 2 may include a plurality of first conductive vias 24 in the second region 22 (e.g., the power region 22). In some embodiments, as shown in FIG. 1, the first conductive vias 24 may be electrically connected to the second patterned circuit structure 6 through a plurality of solders 11 and a plurality of bumps under the solders 11. In other embodiments, the solders 11 and the bumps may be omitted, and the first conductive vias 24 may directly contact the second patterned circuit structure 6. The first conductive vias 24 are disposed in the second region 22 (the power region 22). In some embodiments, most of the first conductive vias 24 may be adapted for power delivery. However, still some of the first conductive vias 24 may serve for other functions, such as signal transmission.

In some embodiments, as shown in FIG. 1, the interposer 2 may further include a plurality of second conductive vias 26 in the first region 21 (the bridge region 21). Similar to the first conductive vias 24, the second conductive vias 26 may be electrically connected to the second patterned circuit structure 6 through the solders 11 and a plurality of bumps under the solders 11, or may directly contact the second patterned circuit structure 6. The second conductive vias 26 are disposed in the first region 21 (the bridge region 21), and are electrically connected to the circuit structure 27. In some embodiments, most of the second conductive vias 26 may be adapted for power delivery. However, still some of the second conductive vias 26 may serve for other functions, such as signal transmission. In other embodiments, the second conductive vias 26 may be omitted.

A distribution density of the second conductive vias 26 is greater than a distribution density of the first conductive vias 24. A pitch between two adjacent first conductive vias 24 is greater than a pitch between two adjacent second conductive vias 26. An amount of the second conductive vias 26 in an unit area is greater than an amount of the first conductive via 24 in an equal unit area. A total amount of the second conductive vias 26 is less than a total amount of the first conductive via 24. However, in other embodiments, the distribution density of the second conductive vias 26 may be less than the distribution density of the first conductive vias 24. The pitch between two adjacent first conductive vias 24 may be less than the pitch between two adjacent second conductive vias 26. The amount of the second conductive vias 26 in an unit area may be less than the amount of the first conductive via 24 in an equal unit area. The total amount of the second conductive vias 26 may be greater than the total amount of the first conductive via 24.

In some embodiments, the interposer 2 may further include a first decoupling structure 25 disposed on the main body 20 (e.g., on the first surface 201 of the main body 20) and in the second region 22 (the power region 22). The first decoupling structure 25 may be a metal-insulator-metal (MIM) capacitor. For example, the first decoupling structure 25 may include a first metal layer 251, an insulator layer 252, a second metal layer 253, a first electrode 254 and a second electrode 255. The first metal layer 251, the insulator layer 252 and the second metal layer 253 are sequentially disposed on the base layer 23 or directly on the main body 20. The first electrode 254 and the second electrode 255 are respectively disposed on and electrically connected to the first metal layer 251 and the second metal layer 253. The first decoupling structure 25 may be insulated from the circuit structure 27, the first conductive vias 24 and/or the second conductive vias 26. For example, the interposer 2 may further include an insulating material 28 disposed between each of the first conductive vias 24 and the first decoupling structure 25, such that the first conductive vias 24 can be insulated from the first decoupling structure 25. In some embodiments, the insulating material 28 may further be disposed between each of the first conductive vias 24 and the main body 20, and between the first electrode 254 and the second metal layer 253 of the first decoupling structure 25. However, in other embodiments, the insulating material 28 may be omitted.

The conductive pillars 12 may be disposed adjacent to or may surround the interposer 2. As shown in FIG. 1, the conductive pillars 12 are disposed on and electrically connected to the second patterned circuit structure 6. Thus, the first patterned circuit structure 3 is electrically connected to the second patterned circuit structure 6 through the conductive pillars 12. In some embodiments, most of the conductive pillars 12 may be adapted for signal transmission. However, still some of the conductive pillars 12 may serve for other functions, such as power delivery. A width of the conductive pillar 12 may be greater than a width of the first conductive via 24 and/or the second conductive via 26. A length of the conductive pillar 12 may be greater than a length of the first conductive via 24 and/or the second conductive via 26. A distribution density of the conductive pillars 12 may be less than the distribution density of the second conductive vias 26 and the distribution density of the first conductive vias 24. A pitch between two adjacent conductive pillars 12 may be greater than the pitch between two adjacent first conductive vias 24 and the pitch between two adjacent second conductive vias 26.

The first encapsulant 14 is disposed on the second patterned circuit structure 6, and encapsulates the interposer 2 and the conductive pillars 12. The first encapsulant 14 has a first surface 141 and a second surface 142 opposite to the first surface 141. The first surface 141 of the first encapsulant 14 may be substantially coplanar with upper surfaces 121 of the conductive pillars 12 and the upper surface of the interposer 2 (including the upper surface of the insulating material 28, the upper surfaces of the first conductive vias 24, the upper surfaces of the second conductive vias 26, the upper surface of the first electrode 254 and the upper surface of the second electrode 255). The second surface 142 of the first encapsulant 14 may contact the second patterned circuit structure 6. As shown in FIG. 1, the second surface 142 of the first encapsulant 14 is lower than the second surface 201 of the main body 20 of the interposer 2. A portion of the first encapsulant 14 is disposed between the interposer 2 and the second patterned circuit structure 6, and contacts and covers the second surface 201 of the main body 20 of the interposer 2, the solders 11 and the bumps. The first encapsulant 14 has a bridge region 145, a power region 146 around the bridge region 145, and a signal region 147 around the power region 146. The interposer 2 is encapsulated in the first encapsulant 14, and is disposed in the bridge region 145 and the power region 146 of the first encapsulant 14.

In some embodiments, the interposer 2 may include a first conductive structure (e.g., the circuit structure 27) disposed in the bridge region 145 of the encapsulant 14, and a second conductive structure (e.g., the first conductive vias 24) disposed in the power region 146 of the encapsulant 14. A circuit density of the first conductive structure (e.g., the circuit structure 27) is greater than a circuit density of the second conductive structure (e.g., the first conductive vias 24). For example, a line width/line space (L/S) of the circuit structure 27 is less than a line width/line space (L/S) of the first conductive vias 24. A pitch between adjacent two traces of the circuit structure 27 is less than a pitch between adjacent two of the first conductive vias 24. A width of the trace of the circuit structure 27 is less than a width of the first conductive via 24. In some embodiments, the circuit density may be referred to line width/line space (L/S) of conductive traces or conductive lines of a circuit layer, or a space or a pitch between conductive vias, or a width of the conductive via.

The conductive pillars 12 extend through the first encapsulant 14. The conductive pillars 12 may be disposed in the signal region 147 of the first encapsulant 14. The circuit density of the second conductive structure (e.g., the first conductive vias 24) of the interposer 2 is greater than a circuit density of the conductive pillars 12. For example, a pitch between adjacent two of the first conductive vias 24 of the interposer 2 is greater than a pitch between adjacent two of the conductive pillars 12. A line width of the first conductive structure (e.g., the circuit structure 27) is less than a line width of the second conductive structure (e.g., the first conductive vias 24), and the line width of the second conductive structure (e.g., the first conductive vias 24) is less than a width of one of the conductive pillars 12.

The first patterned circuit structure 3 may be a conductive structure, a wiring structure, a stacked structure, a redistribution structure or a substrate structure. The first patterned circuit structure 3 is disposed on the first encapsulant 14 and electrically connected to the interposer 2. For example, the first patterned circuit structure 3 is electrically connected to the circuit structure 27, the first conductive vias 24, the second conductive vias 26 and/or the first decoupling structure 25 of the interposer 2. As shown in FIG. 1, the first patterned circuit structure 3 and the second patterned circuit structure 6 are respectively disposed adjacent to the first surface 141 and the second surface 142 of the first encapsulant 14. The first patterned circuit structure 3 may include at least one dielectric layer 31 and at least one redistribution layer 32. As shown in FIG. 1, the first patterned circuit structure 3 includes three dielectric layers 31 and two redistribution layers 32. However, the amount of the dielectric layers 31 and the amount of the redistribution layers 32 are not limited in the present disclosure. In some embodiments, the redistribution layer 32 may include a seed layer and a conductive layer on the seed layer. However, in other embodiments, the seed layer may be omitted. The redistribution layer 32 of the first patterned circuit structure 3 includes at least one inner via 33 and at least one pad 34. As shown in FIG. 1, the inner via 33 may taper downwardly. Thus, a tapering direction of the inner via 33 of the first patterned circuit structure 3 may be same as a tapering direction of the inner via 63 of the second patterned circuit structure 6. In some embodiments, the first patterned circuit structure 3 includes at least one die-bonding region (e.g., a plurality of die-boding region, including a first die-bonding region 35 and a second die-bonding region 36), and the pad 34 is disposed in the die-bonding region (e,g., the first die-bonding region 35 and/or the second die-bonding region 36). The die-bonding region (e,g., the first die-bonding region 35 and/or the second die-bonding region 36) is at least partially located within a vertical projection region of the shrinkage modifier 2 on the first patterned circuit structure 3. A width of the shrinkage modifier 2 is greater than a width of an extent covering all the die-boding regions (e.g., the first die-bonding region 35 and the second die-bonding region 36). A portion of the first encapsulant 14 is disposed between the first patterned circuit structure 3 and the shrinkage modifier 2, and located in a vertical projection region of the die-bonding region (e,g., the first die-bonding region 35 and/or the second die-bonding region 36) of the first patterned circuit structure 3.

The first electronic component 4 is disposed on the first patterned circuit structure 3 and above the interposer 2. The first decoupling structure 25 is disposed between the bridge interposer 2 and the first electronic components 4. In some embodiments, the first electronic component 4 may be disposed in or within the first die-bonding region 35. The first electronic component 4 is disposed on the first encapsulant 14, and located within a vertical projection of the bridge region 145 and the power region 146 of the first encapsulant 14. The first electronic component 4 may include at least one bump 44 electrically connected to the pad 34 of the first patterned circuit structure 3 through the solder materials 13. That is, the first patterned circuit structure 3 is disposed between the first electronic component 4 and the interposer 2. In some embodiments, the first electronic components 4 has a circuit region 47 and a power receiving region 46. The circuit region 47 is adapted for communicating with the other of the electronic components (e.g., the second electronic component 5). The power receiving region 46 is adapted for receiving power from the first conductive vias 24 in the power region 22 of the interposer 2. The first electronic component 4 has a first surface 41 and a second surface 42 opposite to the first surface 41. The second electronic component 5 is disposed side-by-side or adjacent to the first electronic component 4, and on the first patterned circuit structure 3 and above the interposer 2. The first surface 41 of the first electronic component 4 faces the second electronic component 5. The first electronic component 4 and the second electronic component 5 electrically communicate with each other through the interposer 2, such as through the bridge region 21 of the interposer 2. The bridge region 21 of the interposer 2 is closer to a gap between two adjacent electronic components (e.g., the first electronic component 4 and the second electronic component 5) than the power region 22 of the interposer 2 is. At least some of the first conductive vias 24 in the power region 22 of the interposer 2 may be electrically connected to a same one of the electronic components (e.g., the first electronic component 4 or the second electronic component 5). In some embodiments, the second electronic component 5 may be disposed in or within the second die-bonding region 36. The second electronic component 5 is also disposed on the first encapsulant 14, and located within a vertical projection of the bridge region 145 and the power region 146 of the first encapsulant 14. The second electronic component 5 may also include at least one bump 54 electrically connected to another pad 34 of the first patterned circuit structure 3 through the solder materials 13. The first electronic component 4 and the second electronic component 5 are electrically connected to the interposer 2 through the first patterned circuit structure 3. The first electronic component 4 and the second electronic component 5 are located within a vertical projection area 29 of the interposer 2 on the first patterned circuit structure 3. Neither of the first electronic component 4 and the second electronic component 5 extends outside the vertical projection area 29 of the interposer 2. That is, from a top view, an area of the interposer 2 is greater than an area of an assembly of the first electronic component 4 and the second electronic component 5. The die attach area of the first electronic component 4 and the die attach area of the second electronic component 5 are both located within the vertical projection area 29 defined by the lateral surface of the interposer 2. In some embodiments, the first electronic component 4 may be a semiconductor die, such as an application specific integrated circuit (ASIC) die. The second electronic component 5 may also be a semiconductor die, such as a memory die (e.g., a high bandwidth memory (HBM)).

In some embodiments, a heat transfer coefficient of the shrinkage modifier 2 (e.g., the interposer 2) is greater than a heat transfer coefficient of the first electronic component 4 and/or the second electronic component 5. A rigidity of shrinkage modifier 2 (e.g., the interposer 2) is greater than a rigidity of the first electronic component 4 and/or the second electronic component 5. A coefficient of thermal expansion (CTE) of the shrinkage modifier 2 (e.g., the interposer 2) is less than a CTE of the first patterned circuit structure 3 and a CTE of the first encapsulant 14. Hence, the interposer 2 may serve for heat dissipation purpose and/or structural strength enhancement purpose of the package structure 1.

The underfill 15 is disposed between the first electronic component 4, the second electronic component 5 and the first patterned circuit structure 3, and covers the solder materials 13, the bump 54, 44 and the pads 34. The second encapsulant 16 is disposed on the first patterned circuit structure 3 and encapsulates the first electronic component 4, the second electronic component 5 and the underfill 15. However, in some embodiments, the underfill 15 may be omitted, and the second encapsulant 16 may be disposed between the first electronic component 4, the second electronic component 5 and the first patterned circuit structure 3, and covers the solder materials 13, the bumps 54, 44 and the pads 34.

The external connector 17 is disposed below and electrically connected to the second patterned circuit structure 6 for external connection. The second decoupling structure 7 is also disposed below and electrically connected to the second patterned circuit structure 6, and may be disposed between two external connectors 17. That is, the second decoupling structure 7 is disposed below or under the interposer 2 and the first electronic component 4 and/or the second electronic component 5. The second decoupling structure 7 is electrically connected to the first electronic component 4 and/or the second electronic component 5 through the interposer 2. The decoupling structure 7 is disposed closer to the power region 22 of the interposer 2 than to the bridge region 21 of the interposer 2. The decoupling structure 7 is at least partially located within a vertical projection region of the power region 22. The second patterned circuit structure 6 is disposed between the second decoupling structure 7 and the interposer 2. The second decoupling structure 7 may be a capacitor. In some embodiments, as shown in FIG. 1, the second decoupling structure 7 is disposed right below the first electronic component 4 or the second electronic component 5. There is an electrical path passing straightly from the second decoupling structure 7 to the first electronic component 4 and/or the second electronic component 5 through one of the first conductive vias 24 of the interposer 2 without any horizontally extending circuit. The second decoupling structure 7 can provide improved voltage stabilizing and/or noise mitigating function to the first electronic component 4 and/or the second electronic component 5 through the straight electrical path. For example, the first electronic component 4 is disposed directly above the one of the first conductive vias 24 of the interposer 2, and the second decoupling structure 7 is disposed directly below the one of the first conductive vias 24 of interposer 2. The decoupling structure 7 may be located within a vertical projection of the first electronic component 4 and disposed closer to the second surface 42 than to the first surface 41. The decoupling structure 7 may be disposed closer to the power receiving region 46 than to the circuit region 47. In some embodiments, the decoupling structure 7 is located within a vertical projection region of the power receiving region 46. A length of the electrical path is substantially equal to a shortest distance between the first electronic component 4 and the second decoupling structure 7. As shown in FIG. 1, the first patterned circuit structure 3 may include a plurality of stacked inner vias 33 aligned with an electrical contact of the first electronic component 4 and the one of the first conductive via 24 of the interposer 2. The second patterned circuit structure 6 may also include a plurality of stacked inner vias 63 aligned with the electrical contact of the second decoupling structure 7 and the one of the first conductive vias 24 of the interposer 2. Similarly, there may be another electrical path passing straightly from another second decoupling structure 7 to the second electronic component 5 through another one of the first conductive vias 24 of the interposer 2.

In the package structure 1, since the first electronic component 4 and the second electronic component 5 are located within a projection area 29 of the interposer 2 on the first patterned circuit structure 3, the interposer 2 can sufficiently support the entire assembly of the first electronic component 4 and the second electronic component 5, thus is able to eliminate the crack of the first patterned circuit structure 3. In addition, the large area interposer 2 can sufficiently constrain the horizontal expansion or shrinkage of the first patterned circuit structure 3 during a thermal process, so as to reduce a miss joint between the bumps 54, 44 of the first electronic component 4 and the second electronic component 5 and the pads 34 of the first patterned circuit structure 3. In some embodiments, the shrinkage modifier 2 is configured to reduce a relative displacement (or a shift) between the bump 44 of the first electronic component 4 (and/or the bump 54 of the second electronic component 5) and the pad 34 of the first patterned circuit structure 3 along a horizontal direction in an environment of temperature variation.

Figure 2:
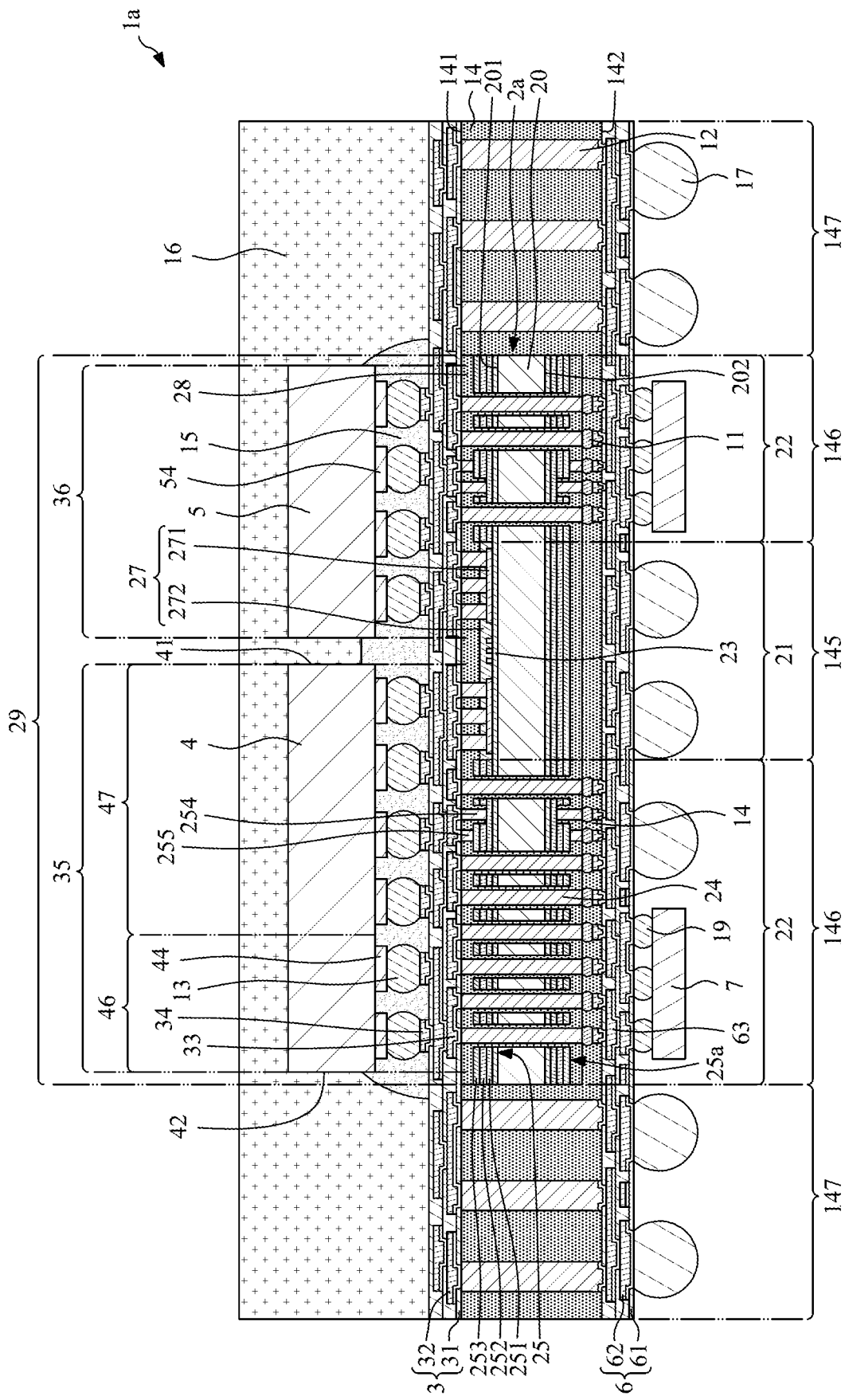
FIG. 2 illustrates a cross sectional view of a package structure according to some embodiments of the present disclosure.

FIG. 2 illustrates a cross sectional view of a package structure 1a according to some embodiments of the present disclosure. The package structure 1a is similar to the package structure 1 shown in FIG. 1, except that the interposer 2a in the package structure 1a further include an additional first decoupling structure 25a, while the second conductive vias 26 are omitted.

As shown in FIG. 2, the additional first decoupling structure 25a is disposed on the second surface 202 of the main body 20. The additional first decoupling structure 25a is electrically connected to the first electronic component 4 and/or the second electronic component 5 through the interposer 2. The additional first decoupling structure 25a has elements and arrangement thereof similar to those of the first decoupling structure 25 (e.g., the first metal layer 251, the insulator layer 252, the second metal layer 253, the first electrode 254 and the second electrode 255). As shown in FIG. 2, the additional decoupling structure 25a may be disposed on the entire second surface 202 of the main body 20. That is, the additional decoupling structure 25a may be disposed in both the first region 21 (the bridge region 21) and the second region 22 (the power region 22) of the main body 2. The additional decoupling structure 25a may be electrically connected to the second patterned circuit structure 6. In some embodiments, the second conductive vias 26 may be omitted in the package structure 1a.

Figure 3:
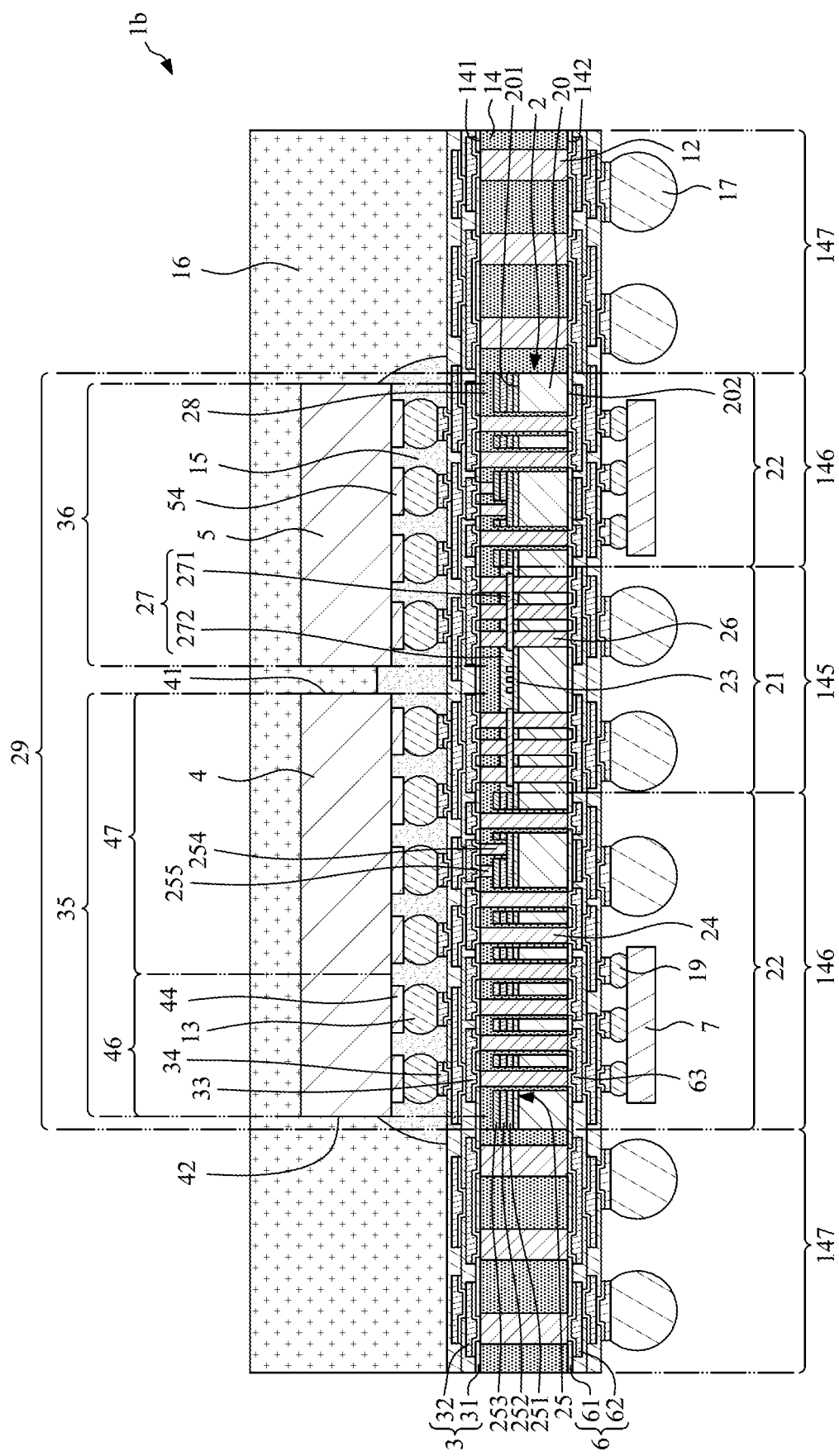
FIG. 3 illustrates a cross sectional view of a package structure according to some embodiments of the present disclosure.

FIG. 3 illustrates a cross sectional view of a package structure 1b according to some embodiments of the present disclosure. The package structure 1b is similar to the package structure 1 shown in FIG. 1, except for the follows.

As shown in FIG. 3, the solders 11 and the bumps under the solders 11 are omitted. Besides, the interposer 2 is in direct contact with and electrically connected to the second patterned circuit structure 6. The second surface 202 of the main body 20 of the interposer 2 is substantially coplanar with the second surface 142 of the first encapsulant 14. A length of the first conductive via 24 is substantially equal to a length of the conductive pillar 12. The inner vias 63 of the second patterned circuit structure 6 tapers upwardly toward the interposer 2. Thus, the tapering direction of the inner via 33 of the first patterned circuit structure 3 may opposite to the tapering direction of the inner via 63 of the second patterned circuit structure 6.

Figure 4:
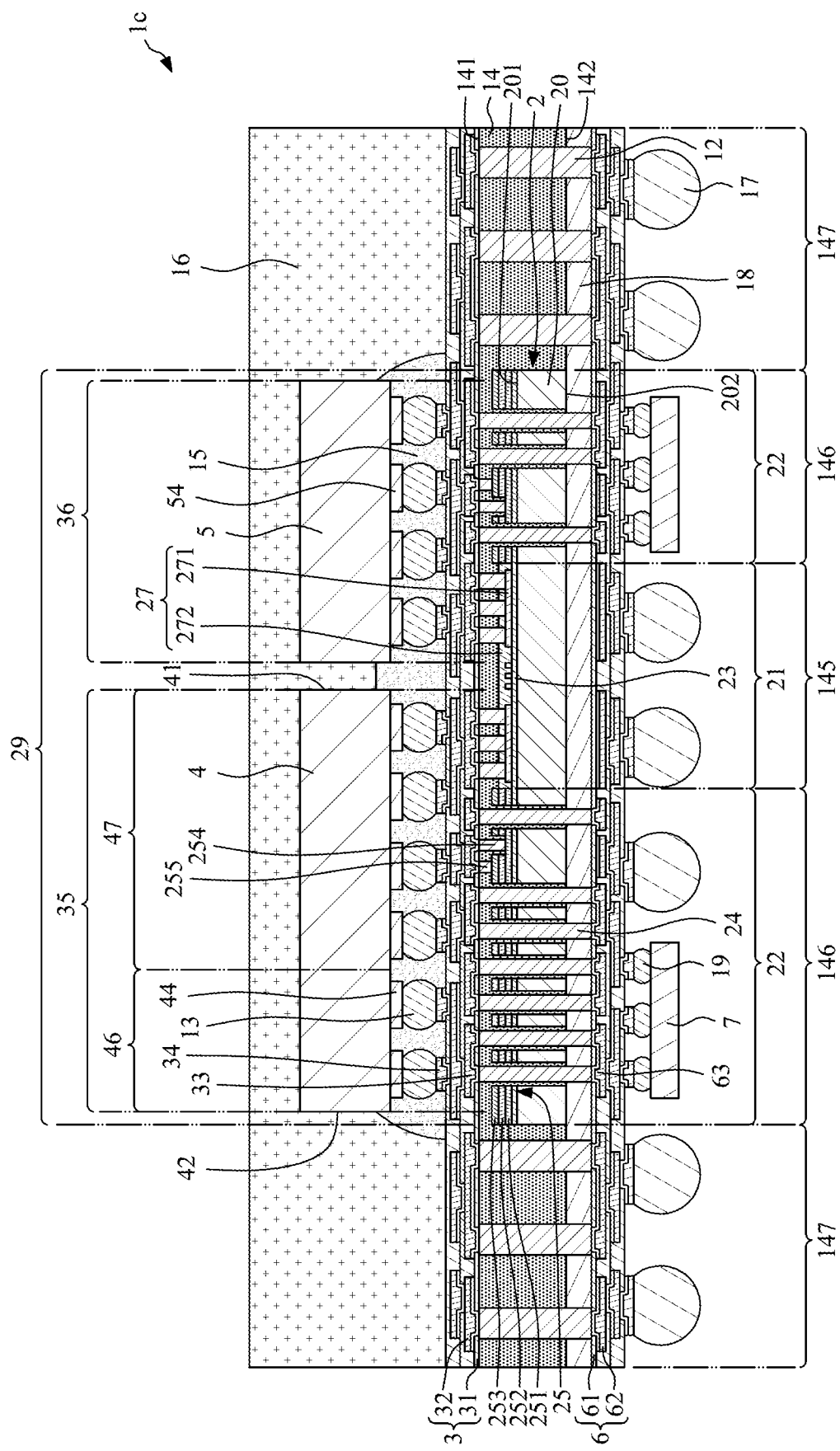
FIG. 4 illustrates a cross sectional view of a package structure according to some embodiments of the present disclosure.

FIG. 4 illustrates a cross sectional view of a package structure 1c according to some embodiments of the present disclosure. The package structure 1c is similar to the package structure 1b shown in FIG. 3, except for the follows.

As shown in FIG. 4, the second conductive vias 26 are omitted. The package structure 1c further include an adhesive layer 18. The adhesive layer 18 is disposed on the second patterned circuit structure 6, and the interposer 2 is disposed on the adhesive layer 18. The first conductive vias 24 of the interposer 2 and the conductive pillars 12 extend through the adhesive layer 18 to contact and electrically connect the second patterned circuit structure 6. Besides, the insulating material 28 of the interposer 2 is omitted. A portion of the first encapsulant 14 is disposed between each of the first conductive vias 24 and the first decoupling structure 25, such that the first conductive vias 24 can be insulated from the first decoupling structure 25. In some embodiments, the first encapsulant 14 may further be disposed between each of the first conductive vias 24 and the main body 20, and between the first electrode 254 and the second metal layer 253 of the first decoupling structure 25.

FIG. 5 through FIG. 10 illustrate a method for manufacturing a package structure according to some embodiments of the present disclosure. In some embodiments, the method is for manufacturing the package structure 1 shown in FIG. 1.

Figure 5:
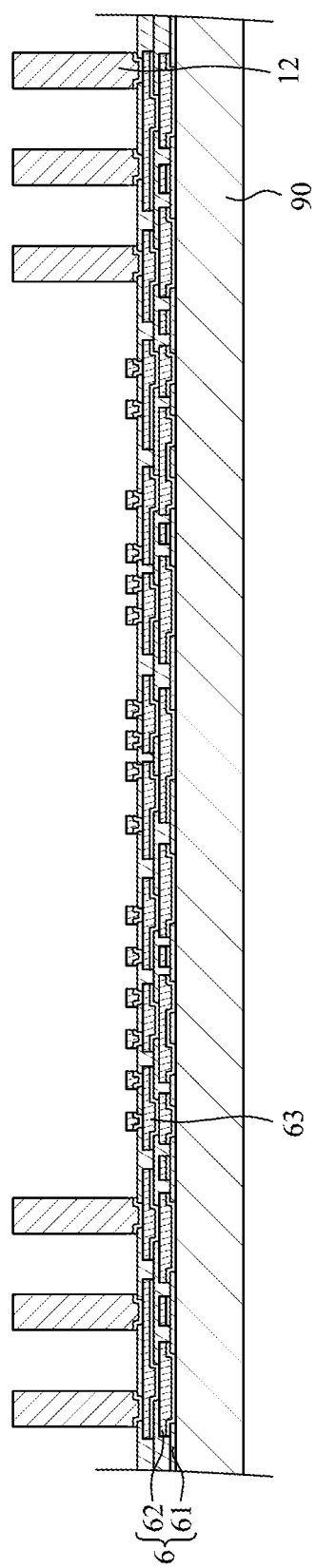
FIG. 5 illustrates one or more stages of an example of a method for manufacturing a package structure according to some embodiments of the present disclosure.

Referring to FIG. 5, a carrier 90 is provided, and a second patterned circuit structure 6 is formed or disposed on the carrier 90. A plurality of conductive pillars 12 is then formed or disposed on the second patterned circuit structure 6, and is electrically connected to the second patterned circuit structure 6. For example, the conductive pillars 12 may be formed by plating.

Figure 6:
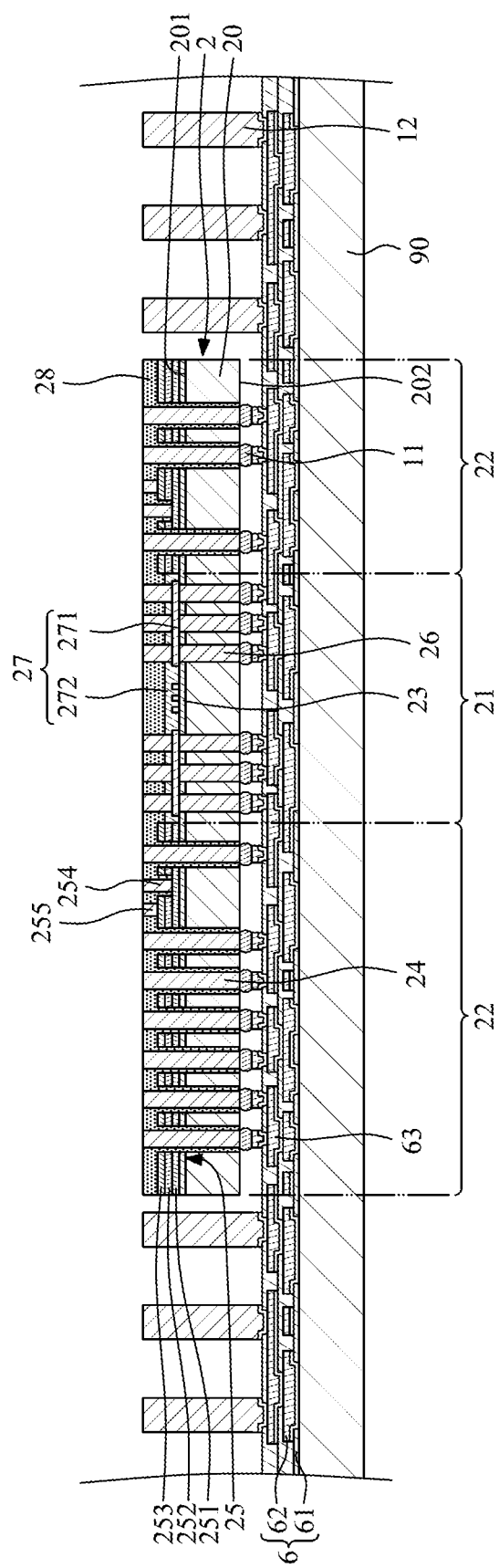
FIG. 6 illustrates one or more stages of an example of a method for manufacturing a package structure according to some embodiments of the present disclosure.

Referring to FIG. 6, an interposer 2 is disposed on the second patterned circuit structure 6, and is electrically connected to the second patterned circuit structure 6 through a plurality of solders 11 and a plurality of bumps under the solders 11. In some embodiments, the interposer 2 of FIG. 6 may be similar to or same as the interposer 2 of FIG. 1.

Figure 7:
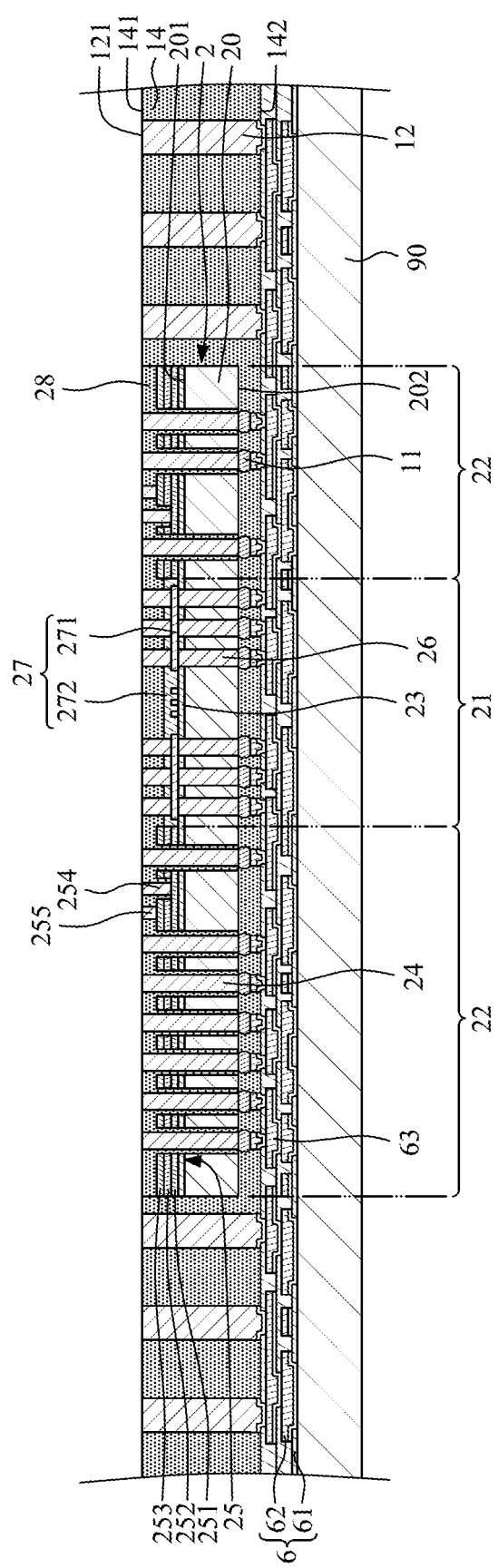
FIG. 7 illustrates one or more stages of an example of a method for manufacturing a package structure according to some embodiments of the present disclosure.

Referring to FIG. 7, a first encapsulant 14 is formed on the second patterned circuit structure 6 to encapsulate the interposer 2 and the conductive pillars 12. In some embodiments, a grinding process may be conducted on a first surface 141 of the first encapsulant 14. Thus, the first surface 141 of the first encapsulant 14 may be substantially coplanar with upper surfaces 121 of the conductive pillars 12 and the upper surface of the interposer 2 (including the upper surface of the insulating material 28, the upper surfaces of the first conductive vias 24, the upper surfaces of the second conductive vias 26, the upper surface of the first electrode 254 and the upper surface of the second electrode 255).

Figure 8:
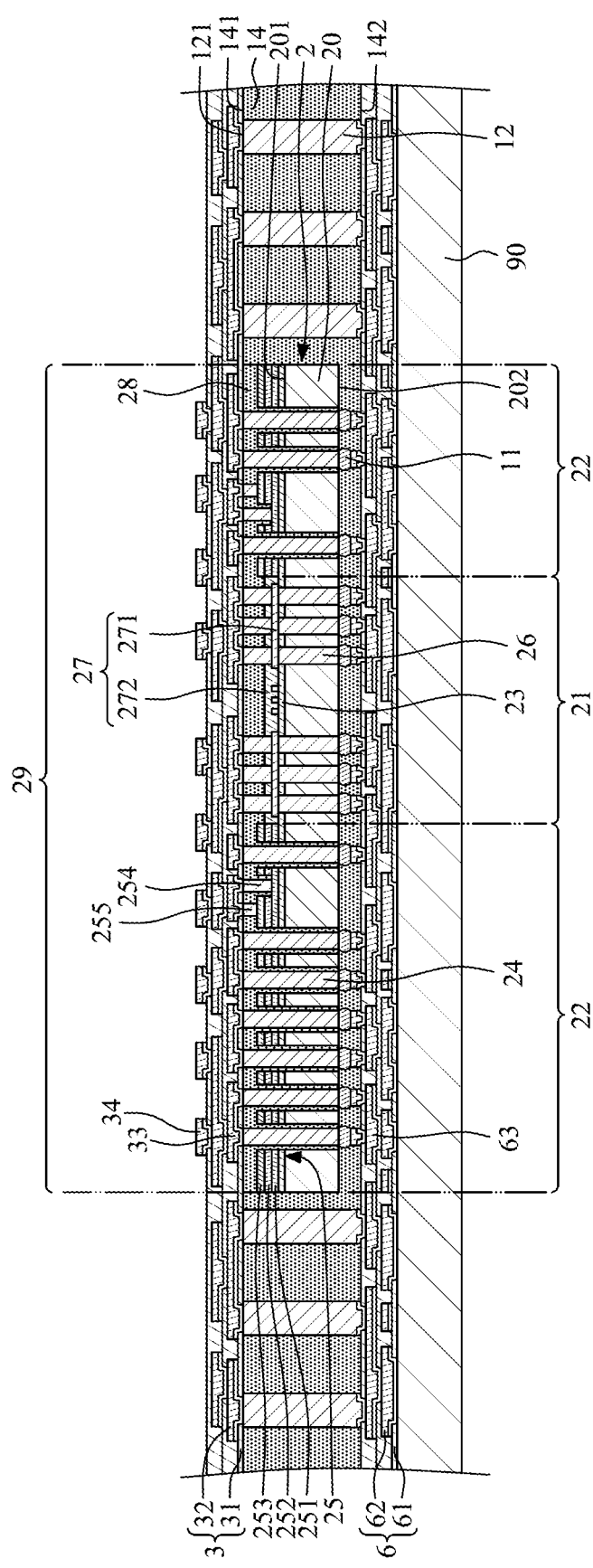
FIG. 8 illustrates one or more stages of an example of a method for manufacturing a package structure according to some embodiments of the present disclosure.

Referring to FIG. 8, a first patterned circuit structure 3 is formed on the first encapsulant 14 to electrically connect the interposer 2 and the conductive pillars 12.

Figure 9:
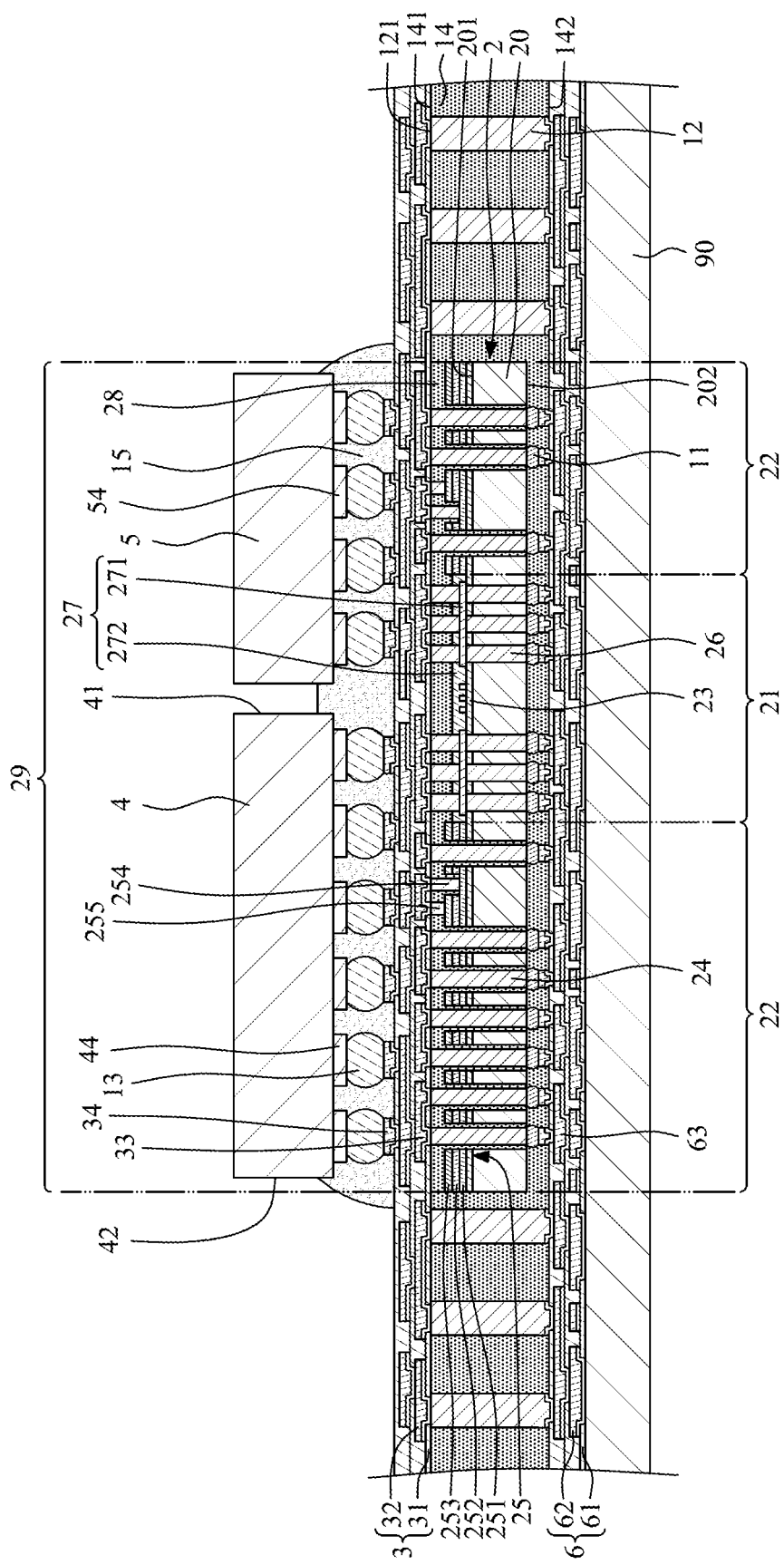
FIG. 9 illustrates one or more stages of an example of a method for manufacturing a package structure according to some embodiments of the present disclosure.

Referring to FIG. 9, a first electronic component 4 and a second electronic component 5 are disposed on the first patterned circuit structure 3. The first electronic component 4 and the second electronic component 5 are located within a projection area 29 of the interposer 2 on the first patterned circuit structure 3. The first electronic component 4 and the second electronic component 5 may be electrically connected to the first patterned circuit structure 3 through a plurality of solder materials 13. Then, an underfill 15 is formed or disposed between the first patterned circuit structure 3 and the first electronic component 4 and/or the second electronic component 5, and covers the solder materials 13.

Figure 10:
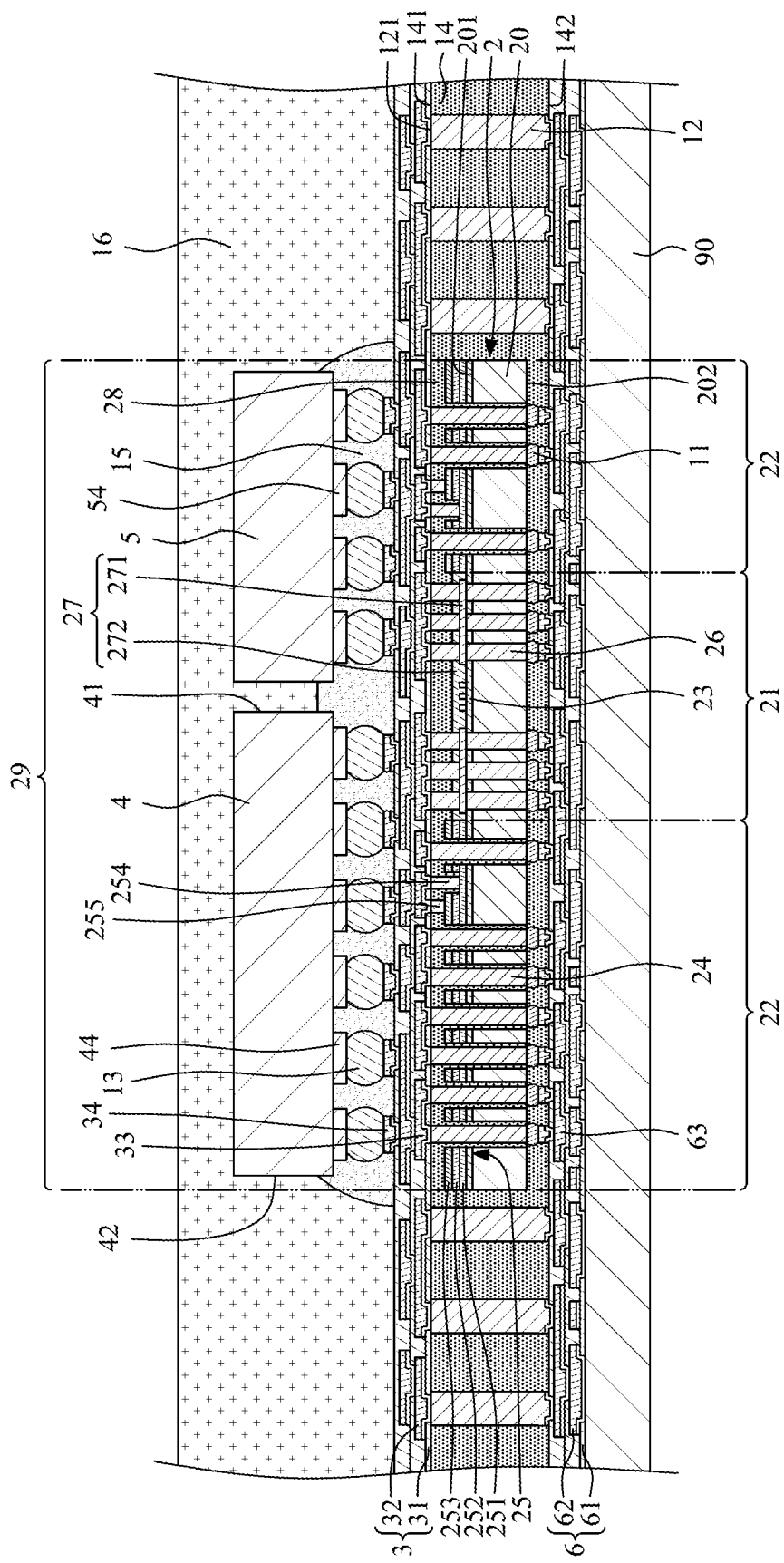
FIG. 10 illustrates one or more stages of an example of a method for manufacturing a package structure according to some embodiments of the present disclosure.

Referring to FIG. 10, a second encapsulant 16 is formed on the first patterned circuit structure 3 to encapsulate the first electronic component 4 and the second electronic component 5. Then, the carrier 90 is removed to expose the second patterned circuit structure 6. At least one second decoupling structure 7 and at least one external connector 17 are disposed on and electrically connected to the second patterned circuit structure 6. Then, a singulation process may be conducted to the second encapsulant 16, the first patterned circuit structure 3, the first encapsulant 14 and the second patterned circuit structure 6, thus forming the package structure 1 as shown in FIG. 1. The package structure 1a shown in FIG. 2 may be formed through stages similar to those shown in and described according to FIG. 5 through FIG. 10.

FIG. 11 through FIG. 14 illustrate a method for manufacturing a package structure according to some embodiments of the present disclosure. In some embodiments, the method is for manufacturing the package structure 1b shown in FIG. 3.

Figure 11:
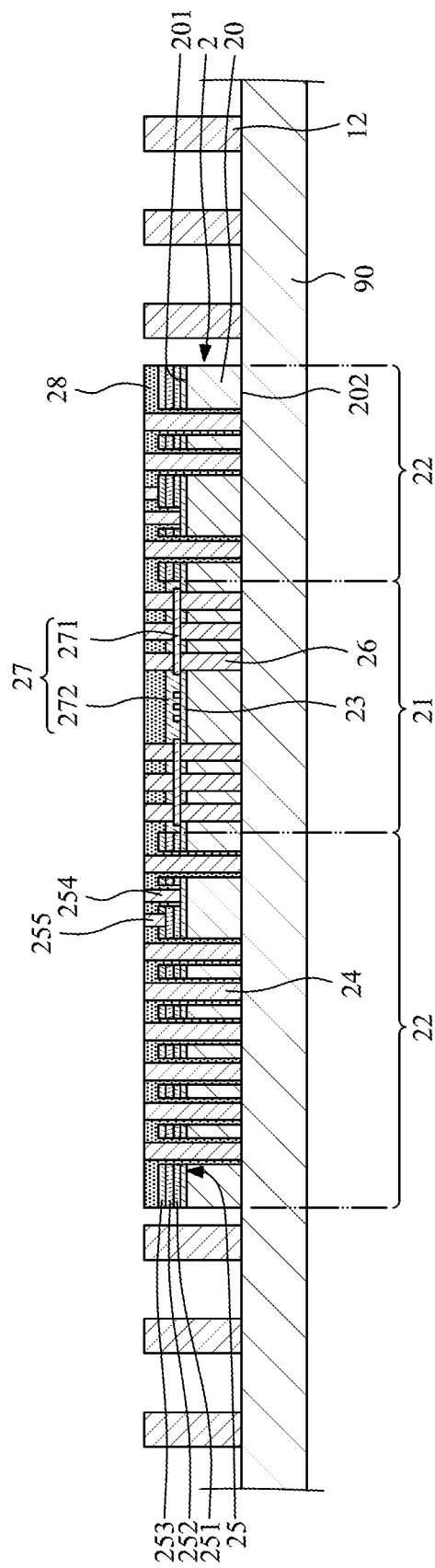
FIG. 11 illustrates one or more stages of an example of a method for manufacturing a package structure according to some embodiments of the present disclosure.

Referring to FIG. 11, a carrier 90 is provided. Then, a plurality of conductive pillars 12 may be formed or disposed on the carrier 90. For example, the carrier 90 may include a seed layer (not shown) for plating the conductive pillars 12. Then, an interposer 2 is disposed on the carrier 90.

Figure 12:
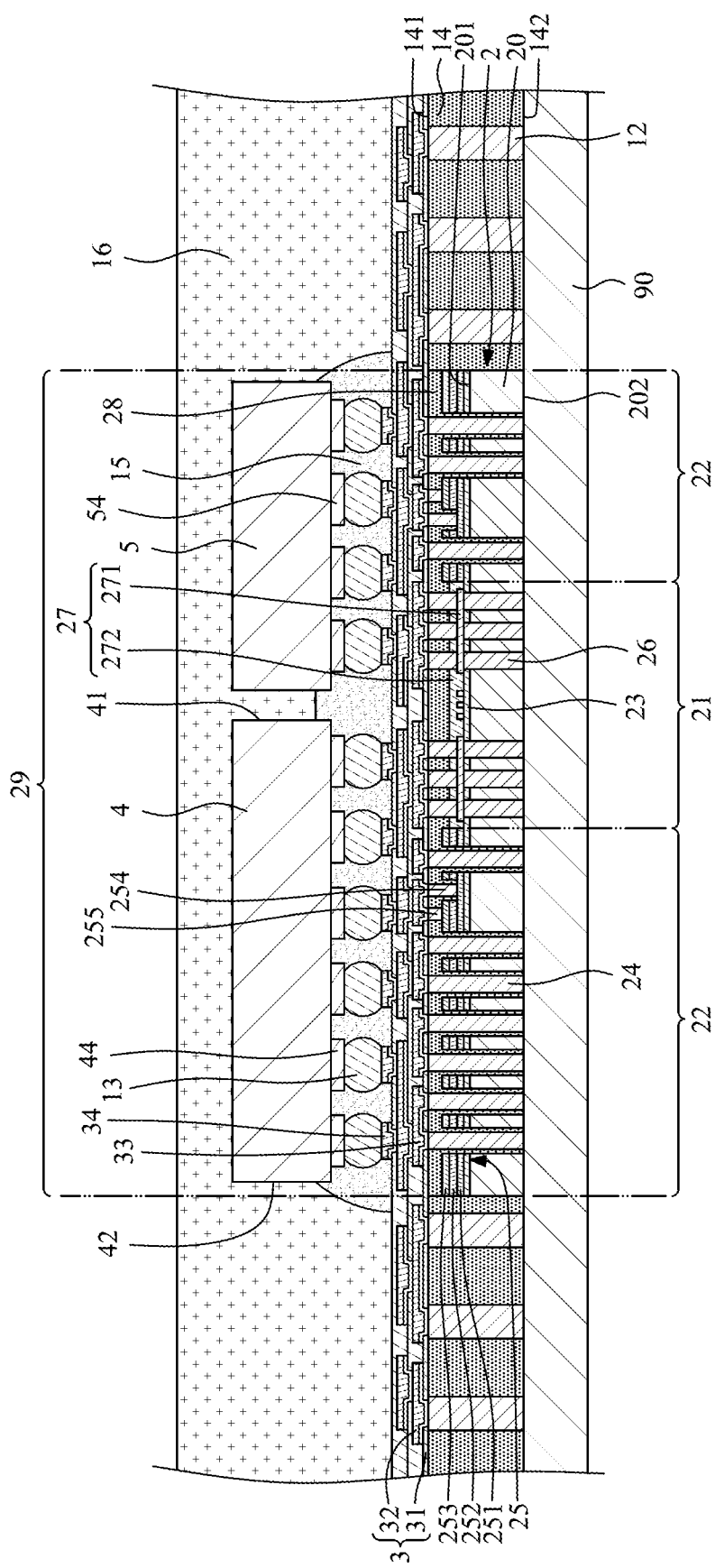
FIG. 12 illustrates one or more stages of an example of a method for manufacturing a package structure according to some embodiments of the present disclosure.

Referring to FIG. 12, a first encapsulant 14 is formed on the carrier 90 to encapsulate the interposer 2 and the conductive pillars 12. A first patterned circuit structure 3 is then formed on the first encapsulant 14 to electrically connect the interposer 2 and the conductive pillars 12. Then, a first electronic component 4 and a second electronic component 5 are disposed on and electrically connected to the first patterned circuit structure 3. An underfill 15 is formed or disposed between the first patterned circuit structure 3 and the first electronic component 4 and/or the second electronic component 5. Then, a second encapsulant 16 is formed on the first patterned circuit structure 3 to encapsulate the first electronic component 4 and the second electronic component 5. The aforementioned stages may be similar to those shown in and described according to FIG. 7 through FIG. 10.

Figure 13:
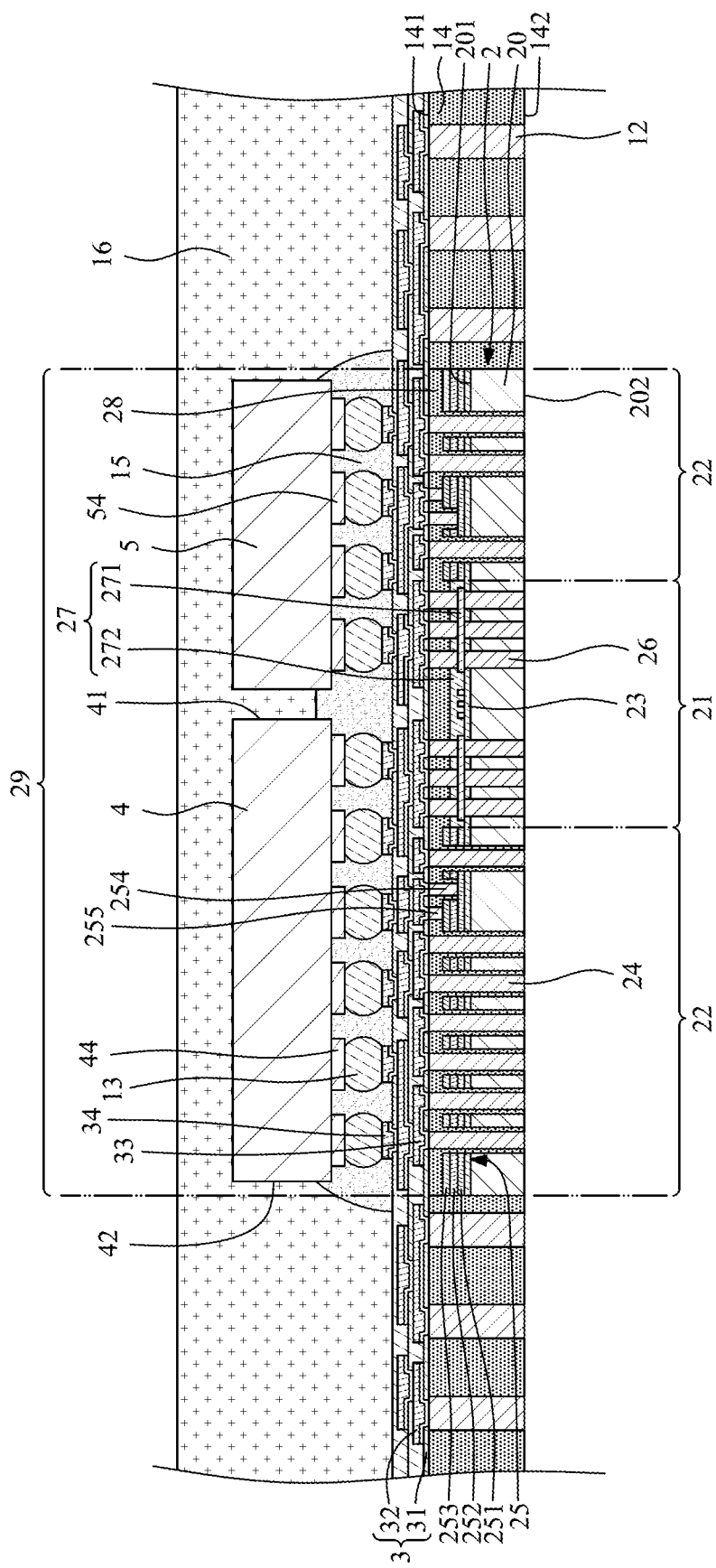
FIG. 13 illustrates one or more stages of an example of a method for manufacturing a package structure according to some embodiments of the present disclosure.

Referring to FIG. 13, the carrier 90 is removed to expose the interposer 2 and the conductive pillars 12.

Figure 14:
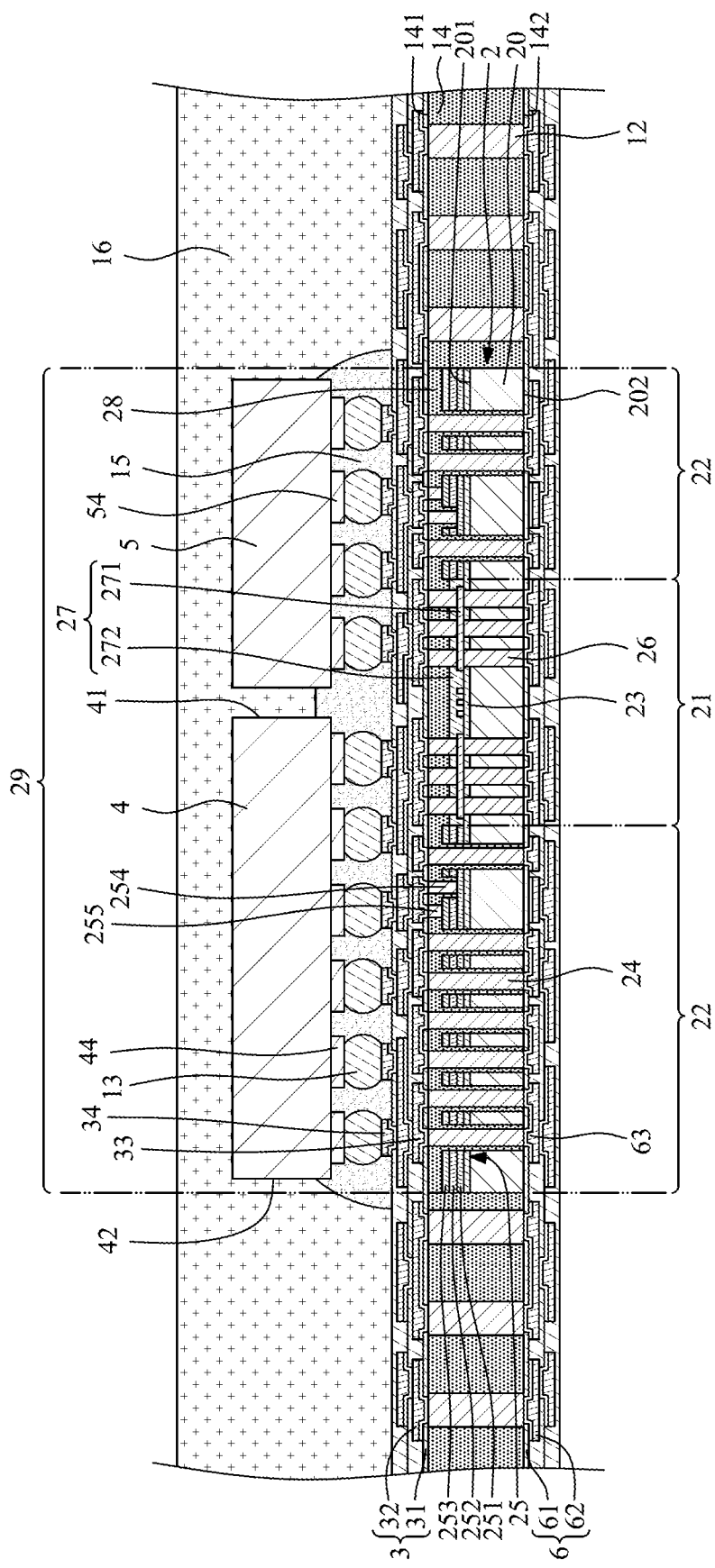
FIG. 14 illustrates one or more stages of an example of a method for manufacturing a package structure according to some embodiments of the present disclosure.

Referring to FIG. 14, a second patterned circuit structure 6 is formed on the first encapsulant 14 to electrically connect the interposer 2 and the conductive pillars 12. Then, at least one second decoupling structure 7 and at least one external connector 17 are disposed on and electrically connected to the second patterned circuit structure 6. Then, a singulation process may be conducted to the second encapsulant 16, the first patterned circuit structure 3, the first encapsulant 14 and the second patterned circuit structure 6, thus forming the package structure 1b as shown in FIG. 3.

FIG. 15 through FIG. 20 illustrate a method for manufacturing a package structure according to some embodiments of the present disclosure. In some embodiments, the method is for manufacturing the package structure 1c shown in FIG. 4.

Figure 15:
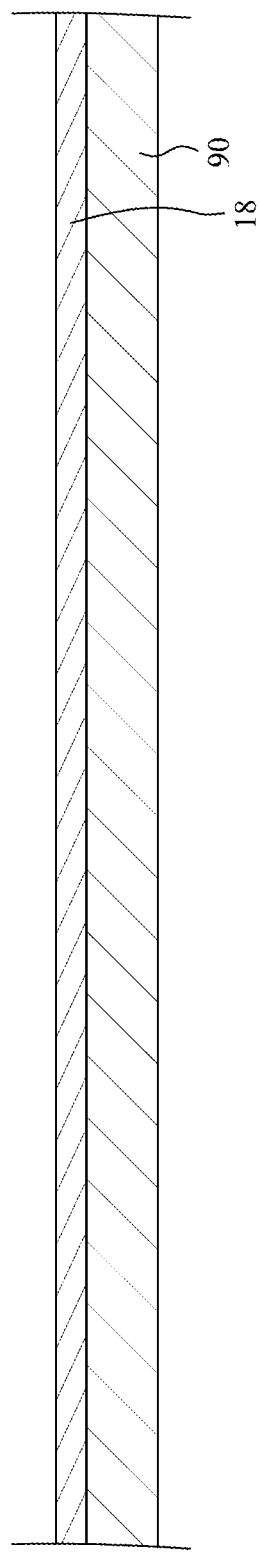
FIG. 15 illustrates one or more stages of an example of a method for manufacturing a package structure according to some embodiments of the present disclosure.

Referring to FIG. 15, a carrier 90 is provided, and an adhesive layer 18 is disposed on the carrier 90.

Figure 16:
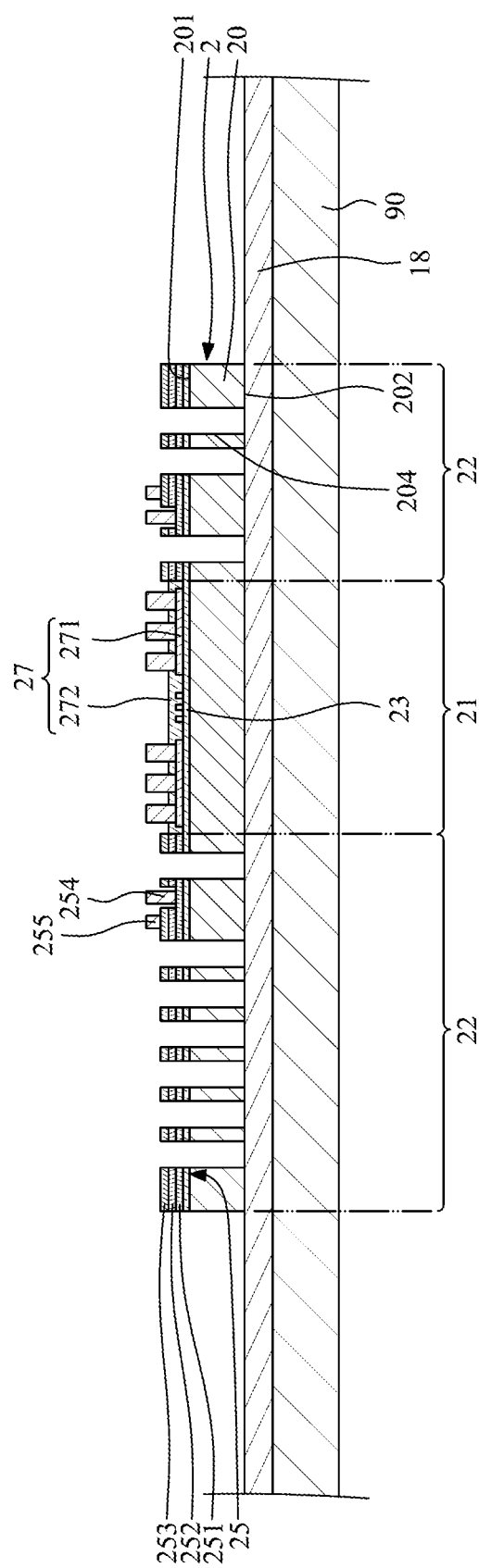
FIG. 16 illustrates one or more stages of an example of a method for manufacturing a package structure according to some embodiments of the present disclosure.

Referring to FIG. 16, an interposer 2 is disposed on the adhesive layer 18. The interposer 2 does not include the first conductive vias 24 shown in FIG. 4. Instead, the interposer 2 defines a plurality of through holes 204 corresponding to the first conductive vias 24.

Figure 17:
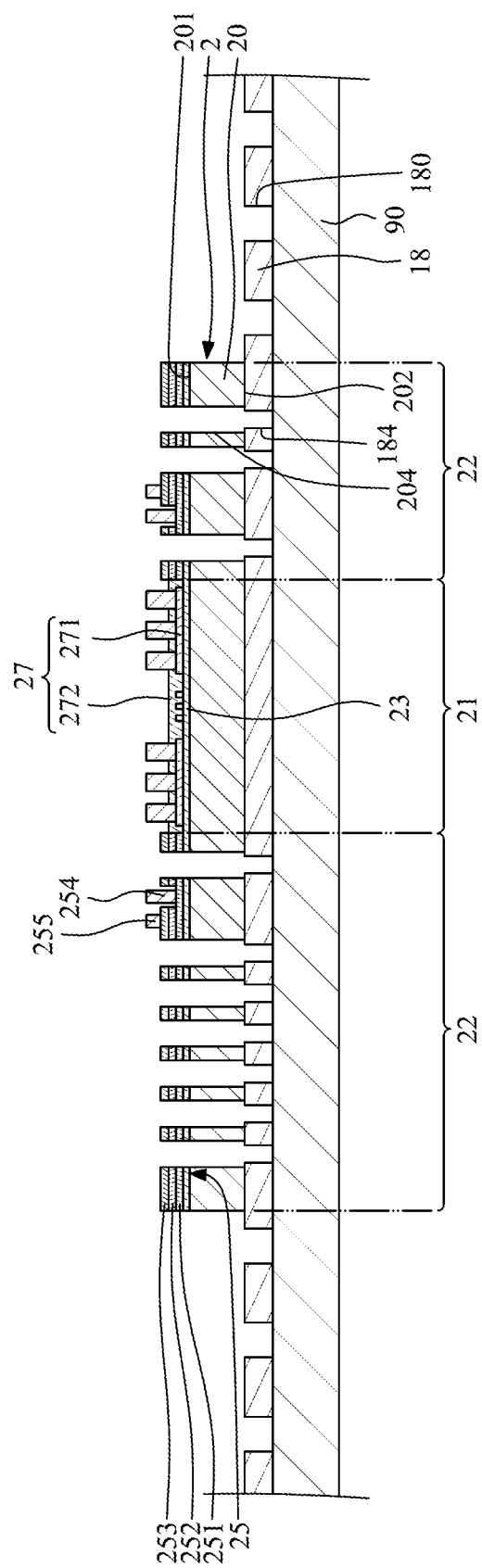
FIG. 17 illustrates one or more stages of an example of a method for manufacturing a package structure according to some embodiments of the present disclosure.

Referring to FIG. 17, a plurality of first through holes 180 and a plurality of second through holes 184 are formed through the adhesive layer 18. The first through holes 180 are formed at predetermined positions of the conductive pillars 12 shown in FIG. 4. The second through holes 184 are formed in and corresponding to the through holes 204 of the interposer 2. The first through holes 180 and the second through holes 184 may be formed by drilling or etching.

Figure 18:
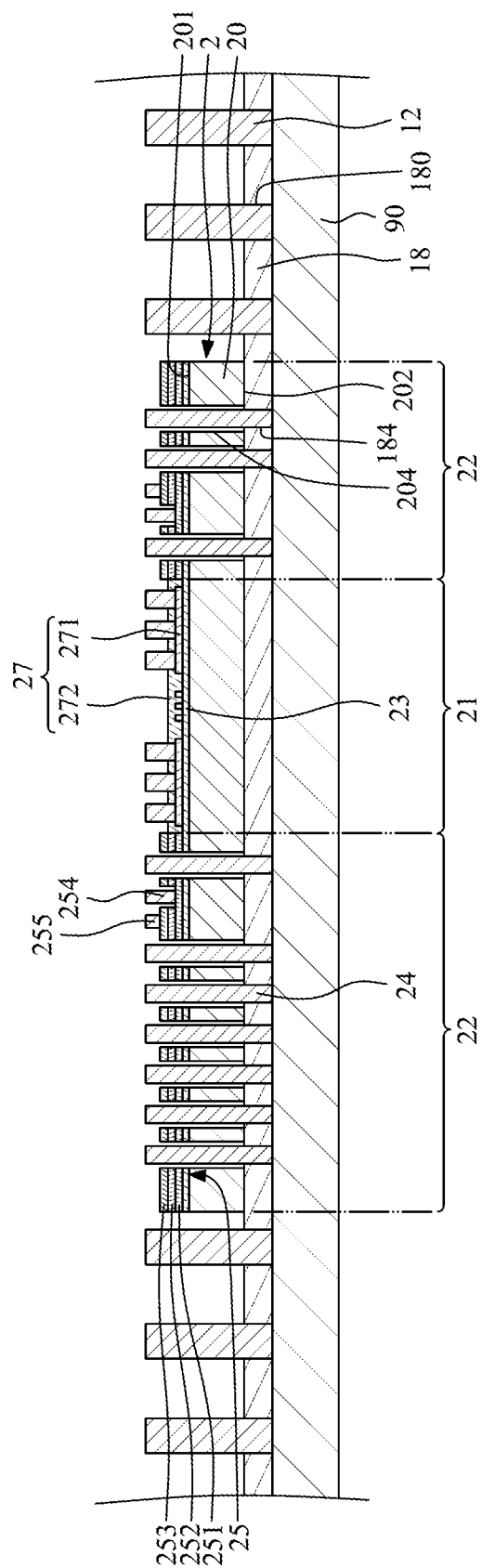
FIG. 18 illustrates one or more stages of an example of a method for manufacturing a package structure according to some embodiments of the present disclosure.

Referring to FIG. 18, a plurality of conductive pillars 12 is formed in the first through holes 180 of the adhesive layer 18, and a plurality of first conductive vias 24 is formed in the second through holes 184 of the adhesive layer 18 and in the through holes 204 of the interposer 2. The conductive pillars 12 and the first conductive vias 24 may be formed at the same time by plating. A length of the first conductive vias 24 may substantially equal to a length of the conductive pillars 12.

Figure 19:
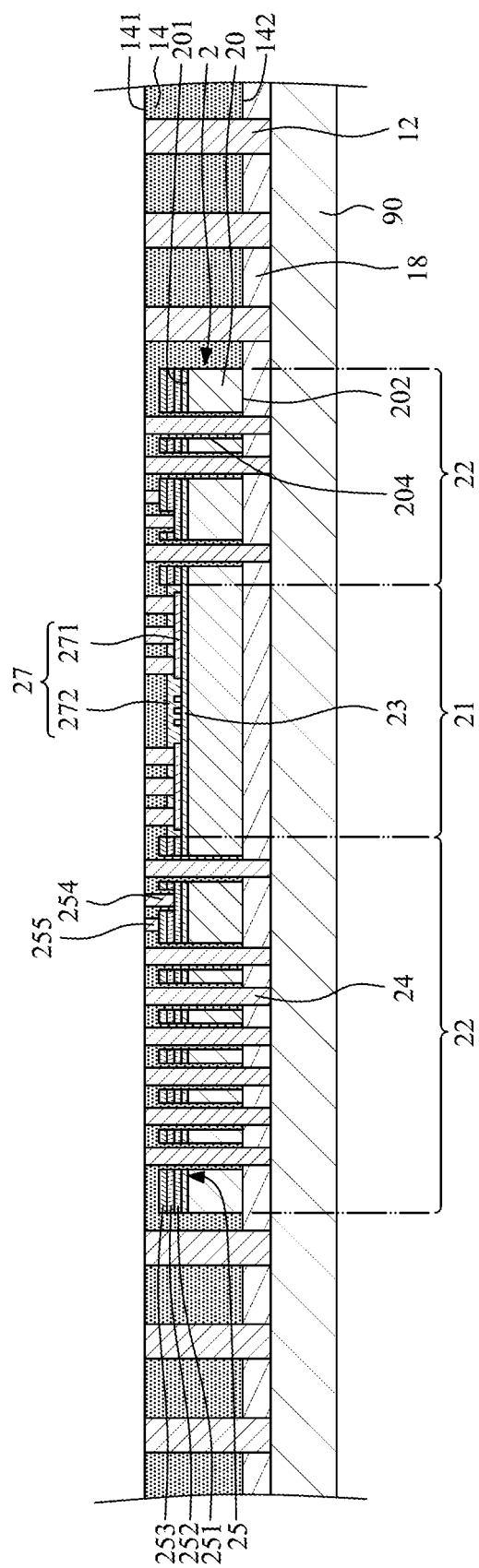
FIG. 19 illustrates one or more stages of an example of a method for manufacturing a package structure according to some embodiments of the present disclosure.

Referring to FIG. 19, a first encapsulant 14 is formed on the adhesive layer 18 to encapsulate the interposer 2 and the conductive pillars 12. A portion of the first encapsulant 14 may be disposed in the through hole 204 of the interposer to surround the first conductive vias 24.

Figure 20:
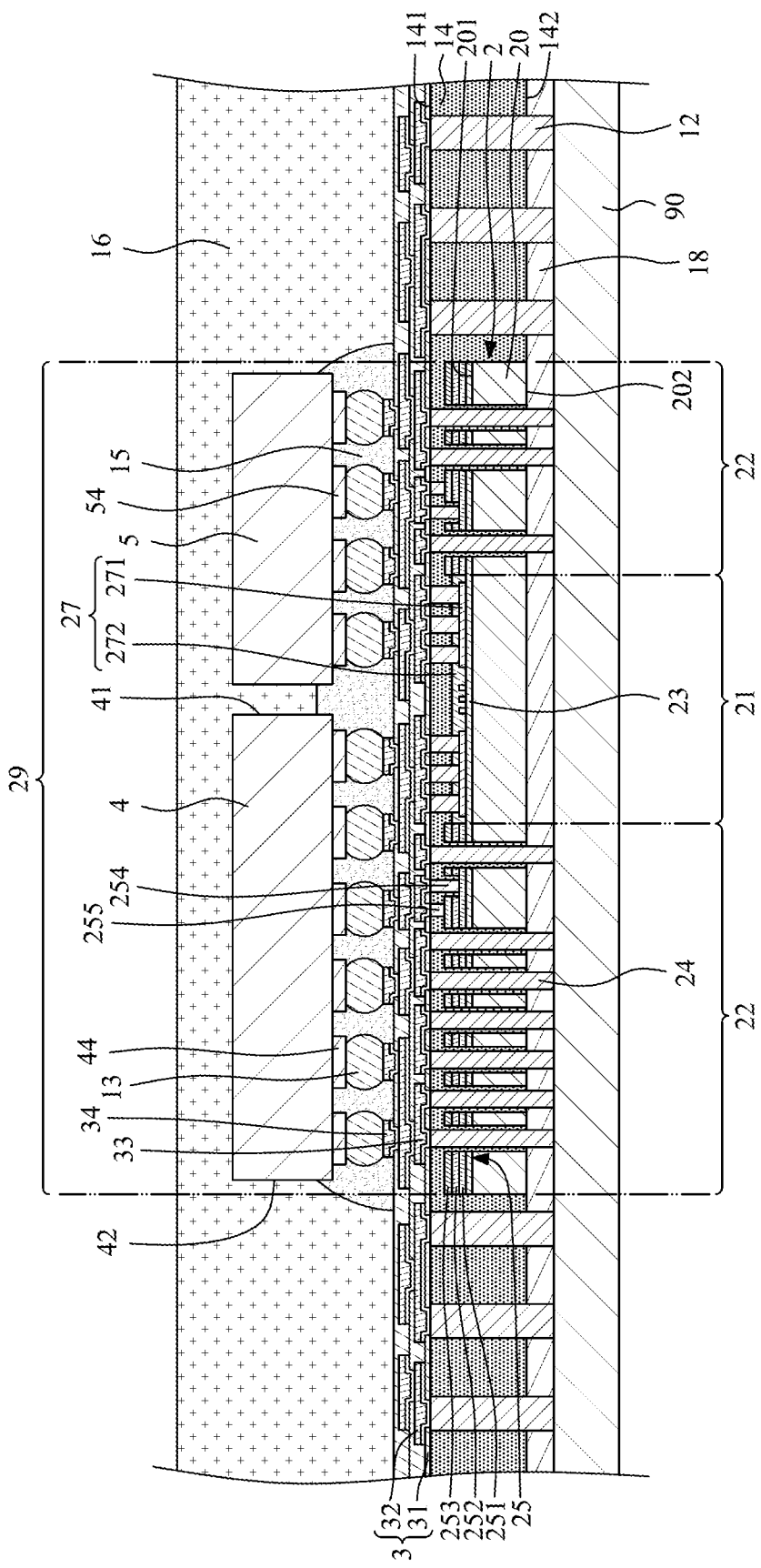
FIG. 20 illustrates one or more stages of an example of a method for manufacturing a package structure according to some embodiments of the present disclosure.

Referring to FIG. 20, a first patterned circuit structure 3 is formed on the first encapsulant 14 to electrically connect the interposer 2 and the conductive pillars 12. Then, a first electronic component 4 and a second electronic component 5 are disposed on and electrically connected to the first patterned circuit structure 3. An underfill 15 is formed or disposed between the first patterned circuit structure 3 and the first electronic component 4 and/or the second electronic component 5. Then, a second encapsulant 16 is formed on the first patterned circuit structure 3 to encapsulate the first electronic component 4 and the second electronic component 5. The aforementioned stages may be similar to those shown in and described according to FIG. 7 through FIG. 10. Then, the carrier 90 is removed to expose the conductive pillars 12 and the first conductive vias 24 of the interposer 2. A second patterned circuit structure 6 is formed on the adhesive layer 18 to electrically connect the conductive pillars 12 and the first conductive vias 24 of the interposer 2. Then, at least one second decoupling structure 7 and at least one external connector 17 are disposed on and electrically connected to the second patterned circuit structure 6. Then, a singulation process may be conducted to the second encapsulant 16, the first patterned circuit structure 3, the first encapsulant 14 and the second patterned circuit structure 6, thus forming the package structure 1c as shown in FIG. 4.

In some embodiments, after the stage shown in FIG. 20 and after removal the carrier 90, the adhesive layer 18 may be removed by grinding to expose a second surface 202 of a main body 20 of the interposer 2 and a second surface 142 of the first encapsulant 14. Portions of the conductive pillar 12 and the first conductive vias 24 of the interposer 2 may also be removed during the grinding process, thus forming a structure similar to that shown in FIG. 13. The stage shown in and described according to FIG. 14 may then be conducted, thus forming a package structure similar to that shown in FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 10+S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
    an encapsulant;
    a patterned circuit structure disposed on the encapsulant, and including a pad;
    at least one electronic component disposed on the patterned circuit structure, and including a bump electrically connected to the pad; and
    a shrinkage modifier encapsulated in the encapsulant and configured to reduce a relative displacement between the bump and the pad along a horizontal direction in an environment of temperature variation, wherein a coefficient of thermal expansion of the shrinkage modifier is less than a coefficient of thermal expansion of the patterned circuit structure and a coefficient of thermal expansion of the encapsulant.

2. The package structure of claim 1, wherein the patterned circuit structure includes a die-bonding region, the electronic component is disposed on the die-bonding region, and the die-bonding region is at least partially located within a vertical projection region of the shrinkage modifier on the patterned circuit structure.

3. The package structure of claim 1, wherein the patterned circuit structure includes a plurality of die-bonding regions, the at least one electronic component includes a plurality of electronic components each disposed in a respective one of the die-bonding regions, and the die-bonding regions are at least partially located within a vertical projection region of the shrinkage modifier on the patterned circuit structure.

4. The package structure of claim 3, wherein a width of the shrinkage modifier is greater than a width of an extent covering all the die-boding regions.

5. The package structure of claim 1, wherein a heat transfer coefficient of the shrinkage modifier is greater than a heat transfer coefficient of the electronic component.

6. The package structure of claim 1, wherein a rigidity of the shrinkage modifier is greater than a rigidity of the electronic component.

7. The package structure of claim 1, wherein the patterned circuit structure includes a die-bonding region, the electronic component is disposed on the die-bonding region, and a portion of the encapsulant is disposed between the patterned circuit structure and the shrinkage modifier, and located in a vertical projection region of the die-bonding region of the patterned circuit structure.

8. A package structure, comprising:
    an interposer;
    a plurality of electronic components disposed above the interposer and electrically communicating with each other through the interposer; and
    a decoupling structure electrically connected to the electronic components through the interposer, wherein the interposer has a power region and a bridge region, the electronic components electrically communicate with each other through the bridge region, and the decoupling structure is disposed closer to the power region than to the bridge region.

9. The package structure of claim 8, wherein the bridge region is closer to a gap between two adjacent electronic components than the power region is.

10. The package structure of claim 9, wherein the interposer comprises a plurality of conductive vias disposed in the power region and electrically connected to a same one of the electronic components.

11. The package structure of claim 9, wherein the decoupling structure is at least partially located within a vertical projection region of the power region.

12. The package structure of claim 11, wherein the decoupling structure is disposed under the interposer.

13. The package structure of claim 10, wherein one of the electronic components has a circuit region and a power receiving region, the circuit region is adapted for communicating with the other of the electronic components, and the decoupling structure is disposed closer to the power receiving region than to the circuit region.

14. The package structure of claim 13, wherein the decoupling structure is located within a vertical projection region of the power receiving region.

15. The package structure of claim 10, wherein the electronic components comprise a first electronic component and a second electronic component disposed adjacent to the first electronic component, the first electronic component has a first surface facing the second electronic component and a second surface opposite to the first surface, and the decoupling structure is located within a vertical projection of the first electronic component and disposed closer to the second surface than to the first surface.

16. A package structure, comprising:
    an encapsulant having a bridge region, a power region around the bridge region, and a signal region around the power region;
    a bridge interposer encapsulated in the encapsulant, and disposed in the bridge region and the power region of the encapsulant, wherein the bridge interposer comprises a first conductive structure disposed in the bridge region of the encapsulant and a second conductive structure disposed in the power region of the encapsulant, and a circuit density of the first conductive structure is greater than a circuit density of the second conductive structure; and
    a plurality of conductive pillars disposed in the signal region of the encapsulant, wherein the circuit density of the second conductive structure is greater than a circuit density of the conductive pillars.

17. The package structure of claim 16, wherein a line width of the first conductive structure is less than a line width of the second conductive structure, and the line width of the second conductive structure is less than a width of one of the conductive pillars.

18. The package structure of claim 16, further comprising a plurality of electronic components, disposed on the encapsulant and located within a vertical projection of the bridge region and the power region of the encapsulant.

* * * * *